(12) United States Patent
Lee et al.

(10) Patent No.: US 6,596,573 B2
(45) Date of Patent: Jul. 22, 2003

(54) THIN FILM TRANSISTOR INCLUDING POLYCRYSTALLINE ACTIVE LAYER AND METHOD FOR FABRICATING THE SAME

(75) Inventors: Seok Woon Lee, Incheon (KR); Seung Ki Joo, Seoul (KR)

(73) Assignee: PT Plus Co. Ltd., Seoul (KR)

( * ) Notice: Subject to any disclaimer, the term of this patent is extended or adjusted under 35 U.S.C. 154(b) by 0 days.

(21) Appl. No.: 09/826,446

(22) Filed: Apr. 4, 2001

(65) Prior Publication Data

US 2002/0074548 A1 Jun. 20, 2002

(30) Foreign Application Priority Data

Oct. 31, 2000 (KR) ........................................ 2000-64352

(51) Int. Cl.[7] .............................................. H01L 21/84
(52) U.S. Cl. ........................ 438/166; 438/149; 438/151
(58) Field of Search ................................ 438/149, 150, 438/151, 153, 154, 155, 157, 166; 257/64, 52–63, 66–69

(56) References Cited

U.S. PATENT DOCUMENTS

| | | | |
|---|---|---|---|
| 5,403,772 A | 4/1995 | Zhang et al. | 437/101 |
| 5,426,064 A | 6/1995 | Zhang et al. | 437/40 |
| 5,488,000 A | 1/1996 | Zhang et al. | 437/21 |
| 5,501,989 A | 3/1996 | Takayama et al. | 437/21 |
| 5,569,610 A | 10/1996 | Zhang et al. | 437/21 |
| 5,940,693 A | 8/1999 | Maekawa | 438/166 |
| 6,242,779 B1 * | 6/2001 | Maekawa | 257/347 |
| 2002/0024047 A1 * | 2/2002 | Yamazaki et al. | 257/59 |

OTHER PUBLICATIONS

Wolf et al., Silocn Processing for the VLSI Era vol. 1—Process Technology. 1986. Lattice Press, pp. 407, 408 and 429–433.*

* cited by examiner

Primary Examiner—Tom Thomas
Assistant Examiner—Douglas W. Owens
(74) Attorney, Agent, or Firm—Baker Botts L.L.P.

(57) ABSTRACT

A thin film transistor (TFT) including a polycrystalline active layer and a method for making the same are disclosed. An amorphous silicon layer is deposited on a substrate and is crystallized by using MJLC (metal induced lateral crystallization) to provide a poly-silicon active layer of the TFT. Specifically, the amorphous silicon layer is polycrystallized during a thermal treatment of the active layer. The thermal treatment causes the MILC of the active layer propagating from portions of the source and the drain regions on which MILC source metal is formed through the contact holes of the TFT.

15 Claims, 7 Drawing Sheets

THIN FILM TRANSISTOR INCLUDING POLYCRYSTALLINE ACTIVE LAYER AND METHOD FOR FABRICATING THE SAME

TECHNICAL FIELD

The present invention relates to a thin film transistor (TFT) used for display devices such as a liquid crystal display (LCD) or an organic light emitting diode (OLED). More particularly, it relates to a thin film transistor including a polycrystalline silicon (i.e., polysilicon) active layer providing the source, drain and channel regions of the TFT, and to a method for making a TFT including the polycrystalline silicon active layer.

BACKGROUND OF THE INVENTION

Thin film transistor (TFTs) used for display devices such as liquid crystal display (LCD) and organic light emitting diode (OLED) is formed by depositing a silicon layer on a transparent substrate such as a glass or quartz, forming a gate and a gate electrode on the silicon layer, implanting dopant in the source and the drain regions of the silicon layer, annealing the silicon layer to activate the dopant, and finally forming an insulation layer thereon. An active layer constituting the source, drain, and channel regions of a TFT is formed by depositing a silicon layer on a transparent substrate such as glass by chemical vapor deposition (CVD) technique. The silicon layer directly deposited on the substrate by the CVD technique is an amorphous silicon layer, which has low electron mobility. As a display device using thin film transistors requires a rapid operation speed and a miniaturized structure, the integration degree of its driving IC becomes higher and the aperture ratio of the pixel region becomes lower. Therefore, it is required to enhance the electron mobility of the silicon layer so that the driving circuit can be formed together with the pixel TFT of the display devices and that the pixel aperture ratio is increased. For this purpose, technologies for forming a polycrystalline silicon layer having high electron mobility by crystallizing an amorphous silicon layer with thermal treatment have been in use as described below.

Solid phase crystallization (SPC) method is used to anneal an amorphous silicon layer at a temperature of 600° C. or below for a few hours or tens of hours. 600° C. is the temperature causing deformation of the glass constituting the substrate. However, the SPC method has the following disadvantages. Since the SPC method requires a thermal treatment for a long time, the SPC method has low productivity. In addition, when annealing a large-sized substrate, the SPC method may cause deformation of the substrate during the extended thermal treatment even at a temperature of 600° C. or below.

Excimer laser crystallization (ELC) method locally generates a high temperature on the silicon layer for a very short time by scanning an excimer laser beam to instantaneously crystallize the silicon layer. However, the ELC method has the following disadvantages. The ELC method has difficulties in accurately controlling the scanning of the laser beam. In addition, since the ELC method processes only one substrate at a time, the ELC method has relatively low productivity as compared to a method wherein a plurality of substrates are processed in a furnace at one time.

To overcome the aforementioned disadvantages of the conventional silicon crystallization methods, a method of inducing crystallization of an amorphous silicon layer at a low temperature about 200° C. by contacting or implanting metals such as nickel, gold, and aluminum has been proposed. This phenomenon that low-temperature crystallization of amorphous silicon is induced with metal is conventionally called as metal induced crystallization (MIC). However, this metal induced crystallization (MIC) method also has following disadvantages. If a TFT is manufactured by the MIC method, the metal component used to induce the crystallization of silicon remains in the crystallized silicon providing the active layer of the TFT. The metal component remaining in the active layer causes current leakage in the channel region of the TFT.

Recently, a method of crystallizing a silicon layer by inducing crystallization of amorphous silicon in the lateral direction using a metal, which is conventionally referred to as "metal induced lateral crystallization" (MILC), was proposed. (See S. W. Lee and S. K. Joe, *IEEE Electron Device Letter*, 17(4), p. 160, 1996). In the metal induced lateral crystallization (MILC) phenomenon, metal does not directly cause the crystallization of the silicon, but the silicide generated by a chemical reaction between metal and silicon induces the crystallization of the silicon. As the crystallization proceeds, the silicide propagates in the lateral direction of the silicon inducing the sequential crystallization of the adjacent silicon region. As the metal causing this MILC, nickel and palladium or the like are known to those skilled in the art. Crystallizing a silicon layer by the MILC, a silicide containing crystallization inducing metal moves along the lateral direction as the crystallization of the silicon layer proceeds. Accordingly, little metal component is left in the silicon layer crystallized by the MILC. Therefore, the crystallized silicon layer does not adversely affect the current leakage or other characteristics of the TFT including the silicon layer. In addition, using the MILC, crystallization of silicon may be induced at a relatively low temperature of 300° C.~500° C. Thus, a plurality of substrates can be crystallized in a furnace at one time without causing any damages to the substrates.

FIG. 1A to FIG. 1D are cross-sectional views illustrating a conventional method for crystallizing a silicon active layer of TFT using the MIC and the MILC methods. Referring to FIG. 1A, an amorphous silicon layer 11 is formed on an insulation substrate 10 having a buffer layer (not shown) thereon. The amorphous silicon layer 11 is patterned by photolithography so as to form an active layer. A gate insulation layer 12 and a gate electrode 13 are formed on the active layer 11 by using conventional methods. As shown in FIG. 1B, the substrate is doped with impurity using the gate electrode 13 as a mask. Thus, a source region 11S, a channel region 11C and a drain region 11D are formed in the active layer. As shown in FIG. 1C, photoresist 14 is formed to cover the gate electrode 13, the source region 11S and the drain region 11D in the vicinity of the gate electrode 13, and a metal layer 15 is deposited over the substrate 10 and the photoresist 14. As shown in FIG. 1D, after removing the photoresist 14, the entire substrate is annealed at a temperature of 300–500° C. As a result, the source and drain regions 16 covered with the residual metal layer 14 are crystallized by the MIC caused by the metal layer 14, and the metal-offset source and drain regions 15 not covered with the metal layer and a channel region 17 under the gate electrode 13 are respectively crystallized by the MILC propagating from the source and drain regions 16 covered with the metal layer 14.

The photoresist 14 is formed to cover source and drain regions adjacent to the gate electrode 13 in order to prevent the current leakage in the channel region and the degradation of the operation characteristics of the same. If the metal layer 15 is formed to cover the entire source and drain regions, the current leakage and the degradation of the operation characteristics occur because the metal component used to cause the MIC remains in the channel region 11C and the boundaries between the channel region and the source and the drain regions. Since the operation of the source and drain regions excluding the channel region are not substantially affected by the residual metal component, the source and drain regions apart from the channel region by a distance over 0.01~5 μm is crystallized by the MIC caused by the MIC metal. Meanwhile, the channel region and the source and the drain regions adjacent to the channel region are crystallized by MILC induced by and propagating from the MIC metal. Crystallizing only the channel region and its vicinity by MILC, the time required to crystallize the entire active layer may be significantly reduced. However, when using the process shown in FIGS. 1A to 1D, a step of forming a photoresist layer, a step of patterning and removing the photoresist should be included in the conventional TFT fabrication process.

FIG. 2A is a TEM photograph of a nickel-silicide line formed in the channel region when crystallizing the silicon layer by the MILC as illustrated in FIGS. 1A~1D using Ni as the crystallization source metal. FIG. 2B illustrates the layout of a TFT, the active layer of which is crystallized by the method of FIGS. 1A~1D. The arrow in FIG. 2B indicates the crystallization direction by the MILC. As show in FIGS. 2A~2B, the nickel-silicide which induces the MILC of the active layer from the portions of the source and drain regions covered with the MIC metal moves toward the channel region as the MILC is progressed on both sides of the channel region. As a result, the nickel-silicide propagating from both sides of the channel region meets around the center of the channel region and forms a boundary in the channel region. A metal component contained in the nickel-silicide deteriorates the electrical characteristics of the channel region such as the field effect mobility and the threshold voltage, and thus adversely affect the performance of the TFT comprising such active layer.

To overcome the aforementioned disadvantages, a technique shown in FIGS. 3A to 3B has been proposed. Referring to FIG. 3A, an active layer 31, a gate insulation layer 32, and a gate electrode 33 are sequentially formed on a substrate 30. A photoresist pattern 34 is formed on the gate electrode 33 and the active layer 31, and a metal layer 35 is deposited to cover the substrate 30 and the photoresist pattern 34. As shown in FIG. 3A, the photoresist pattern 34 is formed to cover the gate electrode 33 and portions of the source and drain regions adjacent to the gate electrode 33. The photoresist is located at a position biased toward either the source region or the drain region. As shown in FIG. 3B, when the photoresist pattern 34 is removed by lift-off or other methods, metal offset areas 37 are formed in the portions of the source and drain regions adjacent to the channel region, and the metal layer 35 resides on the other areas of the source and drain regions. Annealing the substrate 30 in this state, the source and drain regions on which the metal layer 35 is formed are crystallized by the MIC cause by the MIC metal, and the metal-offset areas in the source and drain regions and the channel regions are respectively crystallized by the MILC phenomenon propagated from the MIC regions. As shown in FIG. 3C, since the metal offset area in either the source region or the drain region is broader than the other, the MILC boundary 36 between the crystallized regions may be located outside of the channel region 31C. By doing so, the degradation of the electrical characteristic of the channel area 31C caused by the MILC boundary may be prevented. However, in order to use the process shown in FIGS. 3A to 3C, steps of forming, patterning and removing a photoresist layer also should be included in the conventional TFT fabrication process.

SUMMARY OF THE INVENTION

It is an object of the present invention to provide a thin film transistor including a crystallized active layer and a method for making the same, which overcomes aforementioned problems. The method of the present invention can simultaneously perform the crystallization of a plurality of substrates using MIC and MILC at a lower temperature than those used by the SPC and the ELC methods. Thus, it becomes possible to manufacture poly-silicon TFT's at a low cost without damaging the substrate.

It is another object of the present invention to provide a poly-silicon TFT and a method for making the same, which does not have the MIC metal component and the MILC boundary in the a channel region, without requiring the processes of forming, patterning and removing a photoresist mask.

In order to achieve these objects, the present invention provides a method for fabricating a TFT comprising the steps of a) providing a substrate; (b) depositing an amorphous silicon layer on the substrate to provide an active layer of the TFT including a source, drain and channel regions; (c) forming a gate insulation layer and a gate electrode on the substrate and the active layer; (d) doping impurity in the source and drain regions of the active layer; (e) forming a contact insulation layer on the substrate, the active layer and the gate electrode and forming contact holes in the contact insulation layer to expose portions of the source and drain regions; (f) applying MILC source metal on the portions of the source and drain regions exposed by the contact holes; (g) conducting thermal treatment of the substrate and the active layer to crystallize the active layer formed of amorphous silicon; and (h) forming contact electrodes electrically connected to the source and the drain regions through the contact holes.

In other aspect of the invention, the present invention provides a thin film transistor comprising a substrate; a polysilicon active layer formed on said transparent substrate and including a source, drain and channel regions of the TFT; a gate insulation layer and a gate electrode formed on the substrate and the active layer; a contact insulation layer covering the substrate, the active layer and the gate electrode and including contact holes formed to expose portions of the source and the drain regions; and contact electrodes electrically connected to the source and the drain regions through said contact holes, wherein the active layer of the TFT is formed by crystallizing an amorphous silicon layer formed on the substrate by conducting a thermal treatment of the amorphous silicon layer, and the thermal treatment causes a MILC propagating from the portions of the source and drain regions exposed by the contact holes and having MILC source metal formed thereon.

Additional features and advantages of the present invention will be set forth or will be apparent from below detailed description of the invention. The objectives and other advantages of the invention will be realized and attained by the scheme particularly pointed out in the written description and claims hereof as well as the appended drawings.

BRIEF DESCRIPTION OF THE DRAWINGS

The embodiments of the present invention will be explained with reference to the accompanying drawings, in which.

DETAILED DESCRIPTION OF THE INVENTION

Reference will now be made in detail to the preferred embodiments of the present invention, examples of which are illustrated in the accompanying drawings.

Figure 1A:
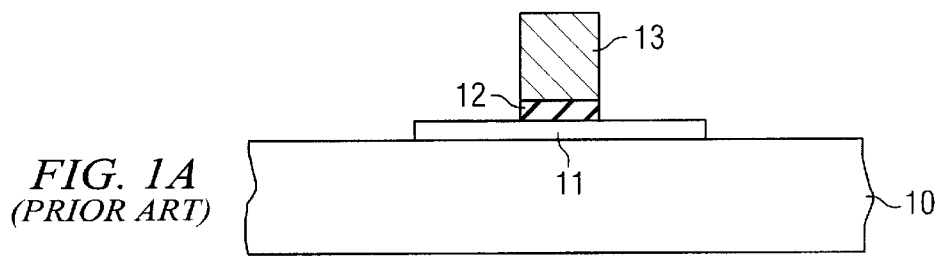
FIG. 1A to FIG. 1D are cross-sectional views illustrating a conventional method for fabricating a poly-silicon TFT using MILC.
Figure 1B:
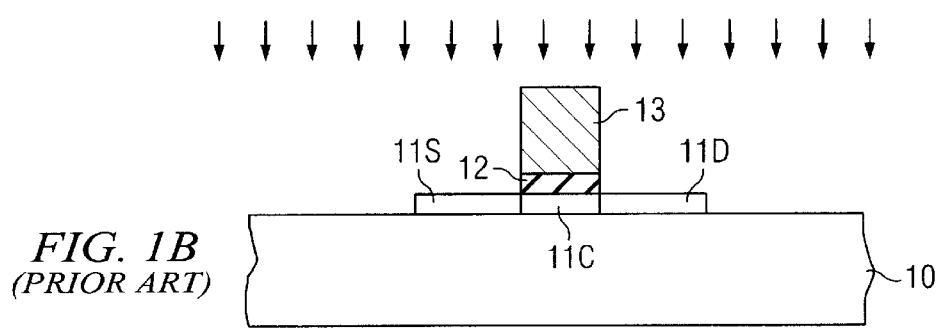
Figure 1C:
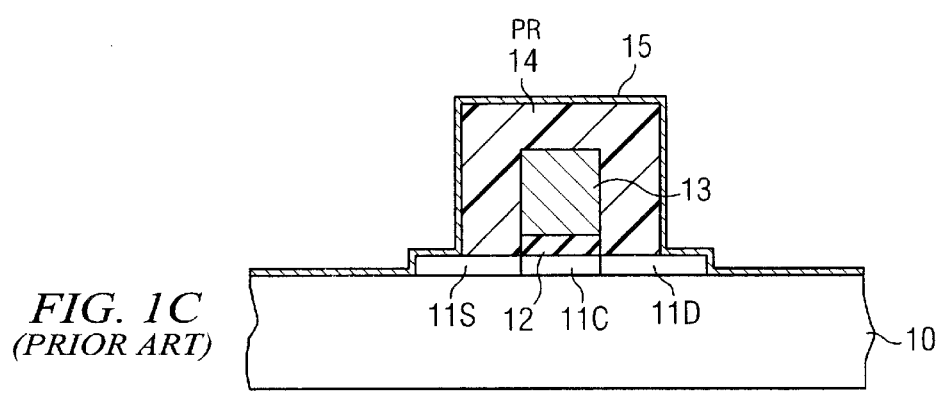
Figure 1D:
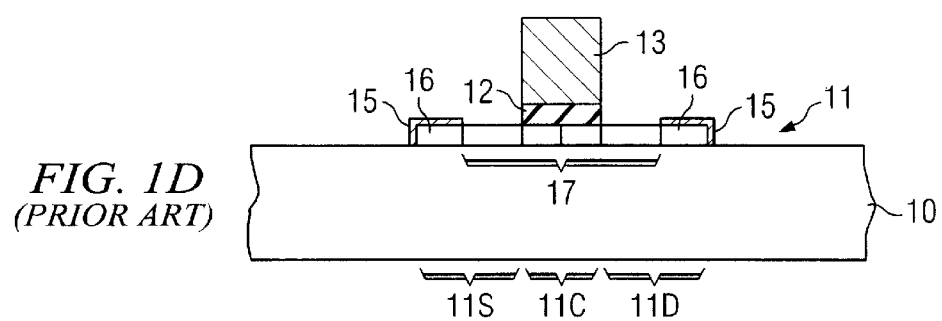
Figure 2A:
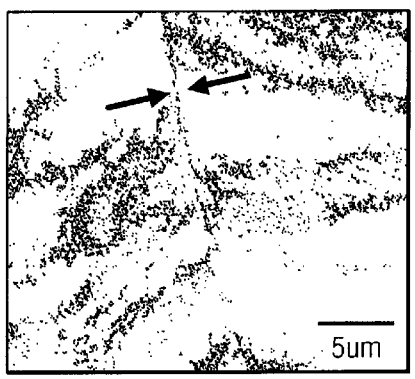
FIG. 2A and FIG. 2B illustrate the crystallization state of the active layer of the TFT fabricated according to the conventional method as illustrated in FIGS. 1A to 1D.
Figure 2B:
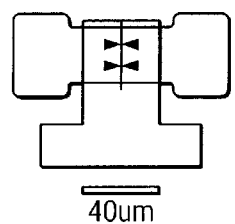
Figure 3A:
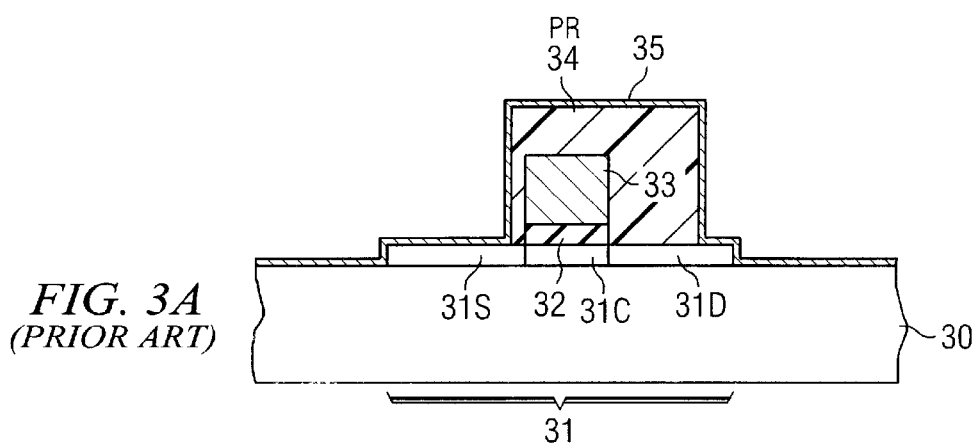
FIG. 3A to FIG. 3C are cross-sectional views illustrating another conventional method for fabricating a poly-silicon TFT using MILC.
Figure 3B:
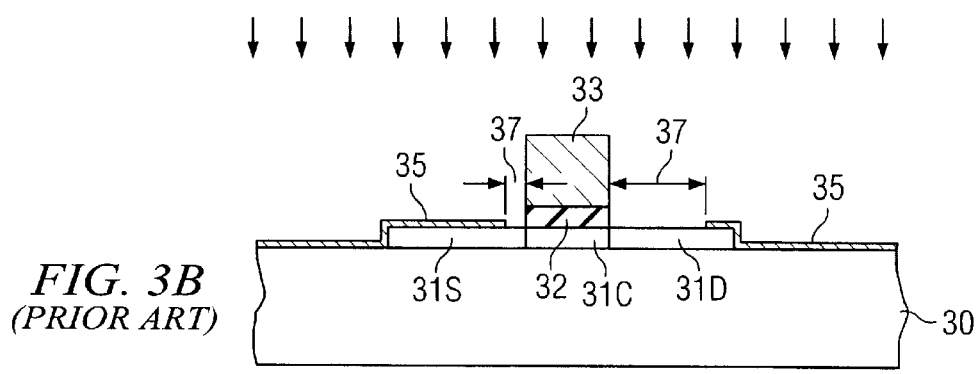
Figure 3C:
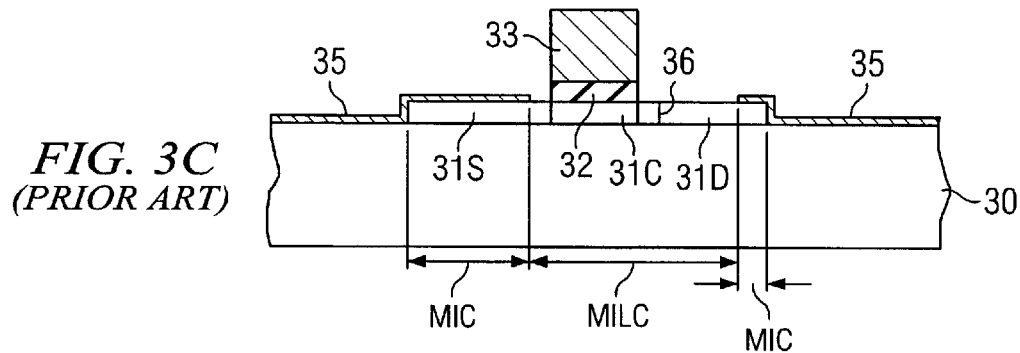
Figure 4F:
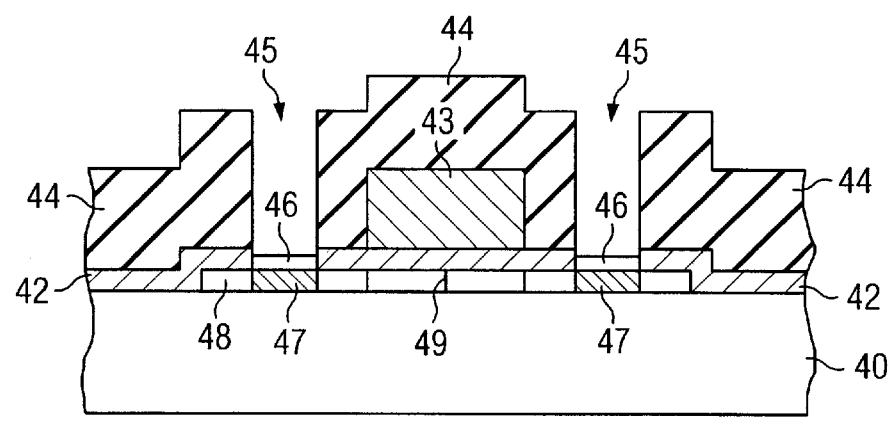
FIG. 4A to FIG. 4G are cross-sectional views illustrating a method for fabricating a poly-silicon TFT according to a preferred embodiment of the present invention.
Figure 4G:
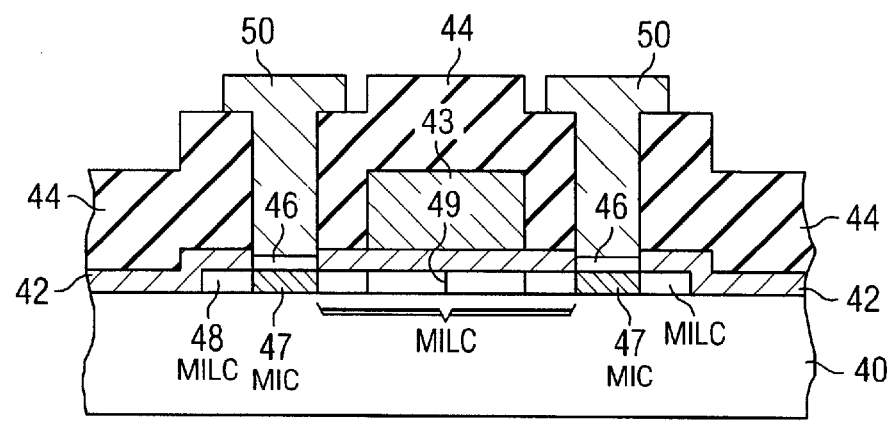
Figure 4A:
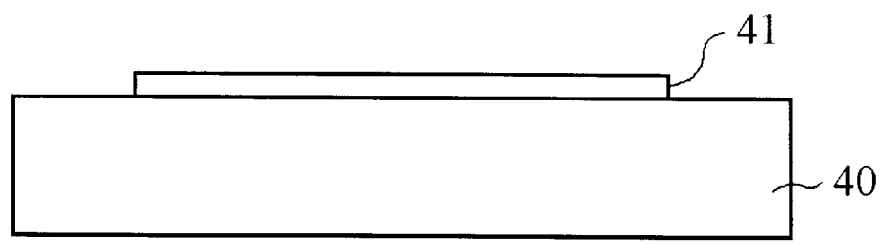

FIG. 4A to FIG. 4G are cross-sectional views illustrating the sequence of the process for fabricating a poly-silicon TFT using the MILC according to one embodiment of the present invention. Referring to FIG. 4A, an amorphous silicon layer 41 constituting the active layer of the TFT is formed and patterned on an insulation substrate 40. The substrate 40 is preferably made of transparent insulator such as non-alkaline glass, quartz or silicon oxide. According to needs, an optional buffer layer (not shown) may be formed on the substrate in order to prevent the diffusion of contaminants from the substrate 40. The buffer layer is formed by depositing $SiO_2$, SiNx, SiOxNy or a combination thereof with a thickness of 300 Å to 10,000 Å, preferably with a thickness in the range of 500 Å to 3,000 Å, at a temperature below 600° C. The buffer layer is formed by various deposition methods such as PECVD (plasma-enhanced chemical vapor deposition), LPCVD (low-pressure chemical vapor deposition), APCVD (atmosphere pressure chemical vapor deposition), ECR CVD (electron cyclotron resonance CVD), and sputtering. The active layer 41 is formed by depositing amorphous silicon with a thickness in the range of 100 Å to 3,000 Å, preferably with a thickness in the range of 500 Å to 1000 Å, by using PECVD, LPCVD or sputtering method. The active layer 41 includes source, drain and channel regions and may also include areas reserved for other devices and electrodes. The active layer 41 is patterned to fit the size of the TFT to be fabricated. The active layer 41 is patterned by dry etching using a mask made by photolithography.

Figure 4B:
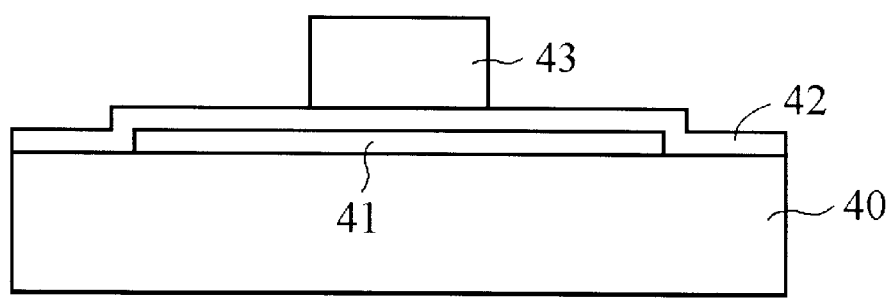

FIG. 4B illustrates a cross-section of the structure in which a gate insulation layer 42 and a gate electrode 43 are formed on the substrate 40 and the patterned active layer 41. As shown in FIG. 4B, the gate insulation layer 42 is formed by depositing $SiO_2$, SiNx, SiOxNy or a combination thereof with a thickness in the range of 300 Å to 3,000 Å, preferably with a thickness in the range of 500 Å to 1,000 Å using various deposition methods such as PECVD, LPCVD, APCVD and ECR CVD. Then, the gate electrode layer consisting of conductive material such as metal and doped poly-silicon is formed on the gate insulation layer 42 by sputtering, heating evaporation, PECVD, LPCVD, APCVD, or ECR CVD, and it is patterned to form the gate electrode 43. The gate electrode layer is formed with a thickness in the range of 1,000 Å to 8,000 Å, preferably with a thickness in the range of 2,000 Å to 4,000 Å. The gate electrode 43 is patterned by a wet etching or dry etching method according to a pattern made by photolithography.

Figure 4C:
Figure 4C:
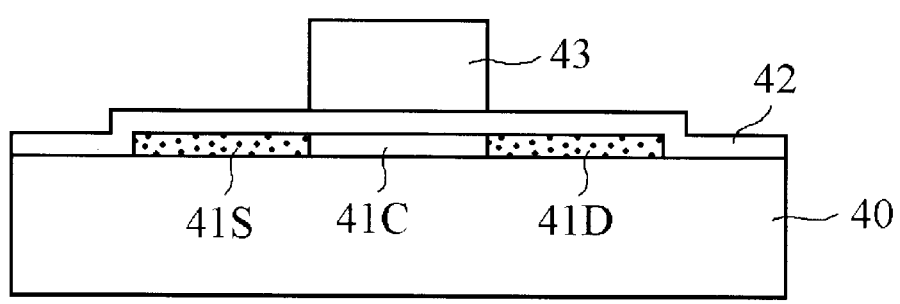

FIG. 4C is a cross-sectional view illustrating the process of doping the source region 41S and the drain region 41D of the active layer 41 using the gate electrode 43 as a mask. For fabricating a NMOS (N-channel metal oxide semiconductor) TFT, the active layer is doped with a dopant such as $PH_3$, P and As with a concentration of $1E11\sim1E22/cm^3$ (preferably $1E15\sim1E21/cm^3$) at the energy level of 10~200 KeV (preferably 30~100 KeV) using ion shower doping method or ion implantation method, etc. For fabricating a PMOS (P-channel metal oxide semiconductor) TFT, the active layer is doped with a dopant such as $B_2H_6$, B and $BH_3$ with a concentration of $1E11\sim1E22/cm^3$ (preferably $1E14\sim1E21/cm^3$) at the energy level of 20~70 KeV. In order to form a lightly doped region or an offset junction region in the drain region, or to fabricate a CMOS, the doping process may be conducted in multiple stages employing additional masks.

Figure 4D:
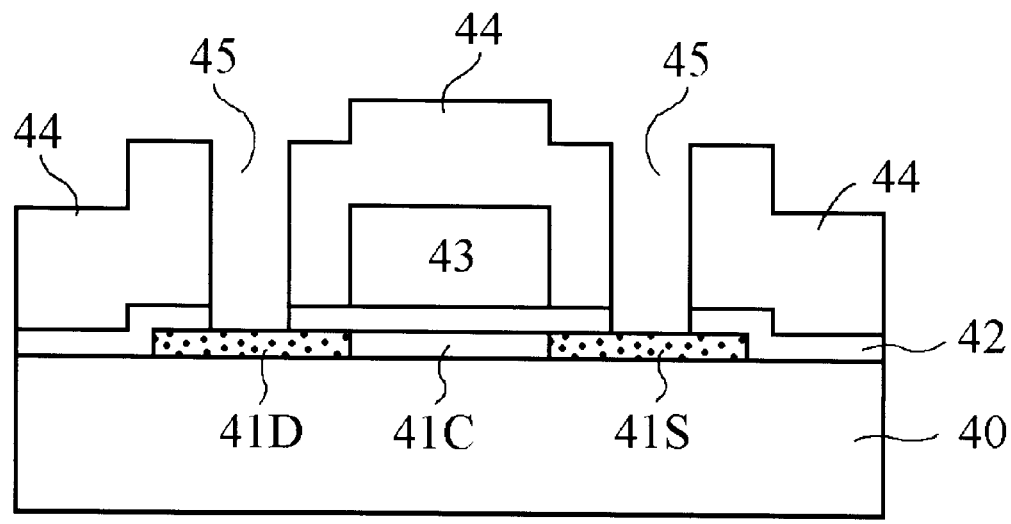

FIG. 4D is a cross-sectional view illustrating a structure in which a contact insulation layer 44 is formed on the gate insulation layer 42 and the gate electrode 43 and contact holes 45 are formed in the gate insulation layer 44. The contact insulation layer 44 is formed by depositing $SiO_2$, SiNx, SiOxNy, or a combination thereof with a thickness in the range of 1,000 Å to 15,000 Å, preferably with a thickness in the range of 3,000 Å to 7,000 Å by using various deposition methods such as PECVD, LPCVD, APCVD, ECR CVD and sputtering. The contact insulation layer 44 is patterned by wet etching or dry etching according to a photolithography pattern in order to form the contact holes 45 therein. The contact hole 45 provides a path though which a contact electrode is electrically connected to the source/drain regions of the active layer.

Figure 4E:
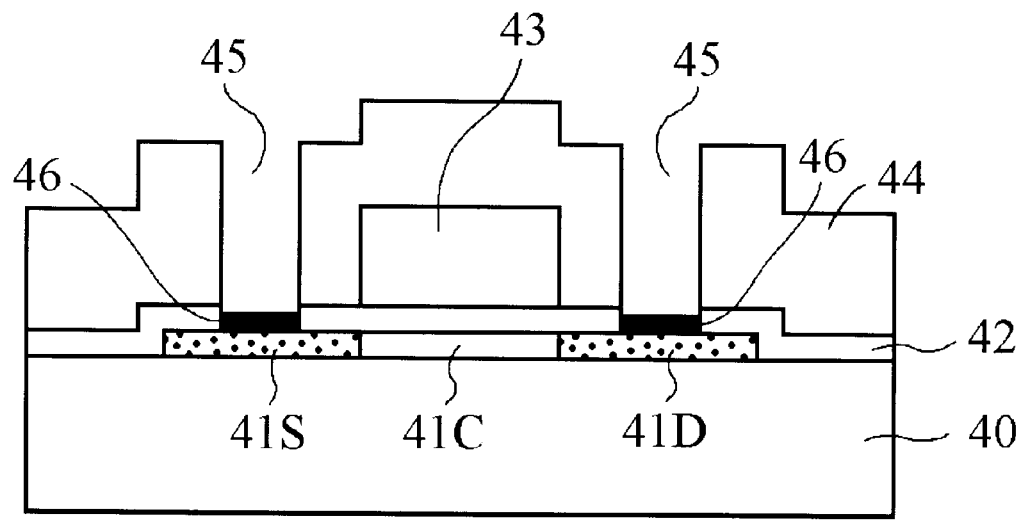

FIG. 4E is a cross-sectional view illustrating that a metal layer 46 for inducing the MILC of the amorphous silicon active layer is formed on the portions of the source region 41S and the drain region 41D which are exposed though the contact hole 45. Although, Ni or Pd is preferably used as the source metal for inducing the MILC in the amorphous silicon, other metals such as Ti, Ag, Au, Al, Sn, Sb, Cu, Co, Cr, Mo, Tr, Ru, Rh, Cd and Pt or their combination may also be used as the MILC source metal 46. Although the MILC source metal such as Ni and Pd may be formed on active layer by sputtering, heating evaporation, PECVD, or ion implantation, sputtering method is preferably used to form the MILC source metal 46. The thickness of the metal layer 46 can be freely selected within a range that is adequate to induce the MILC of the active layer. The metal layer 46 is formed with a thickness in the range of 1 Å to 10,000 Å, preferably with a thickness in the range of 10 Å to 200 Å.

The MILC source metal can be deposited on the active layer without removing the mask such as photoresist, which was formed on the contact insulation layer 44 to form the contact holes 45. Alternatively, the MILC source metal can be deposited on the active layer after removing the mask. If the MILC source metal 46 is deposited prior to removing the mask, a MILC source metal formed outside of the contact hole 45 is automatically removed when removing the mask from the contact insulation layer 44. In the case, the process for removing the MILC source metal deposited outside of the contact hole may be eliminated. In the present invention, since the MILC source metal is formed on the portions of the source and drain regions exposed through the contact hole 45, the MILC source metal can be formed on predetermined positions of the source and drain regions 41S and 41D without requiring additional mask. Thus, the MILC source metal 46 can be offset from the channel region 41C of the active layer.

FIG. 4F illustrates a process of crystallizing the active layer by conducting a thermal treatment after forming the MILC source metal 46 in the contact holes 45, and activating the dopant implanted in the source and drain regions of the active layer. For the thermal treatment, RTA (rapid thermal annealing) or ELC (excimer laser crystallization) method can be used. The RTA method heats the substrate at a temperature range of 700° C.~800° C. for a few seconds or a few minutes using a heating lamp such as tungsten-halogen lamp or a xenon arc lamp. The ELC method heats the substrate at a very high temperature for a very short time using excimer laser. In the present invention, the active layer is preferably crystallized using the MILC, which can crystallize amorphous silicon into poly-silicon at a relatively low temperature in the range of 300° C.~600° C. Preferably, the crystallization thermal treatment is performed in a furnace at a temperature of 400° C.~600° C. for 0.1~50 hours, more preferably for 0.5~20 hours. During the thermal treatment in a furnace, the source and drain regions 47 on which the MILC source metal is formed are crystallized by MIC caused by the MILC source metal. The remaining portions of the source and drain regions and the channel region which are not covered with the MILC source metal 46 are crystallized by MILC propagating from the regions crystallized by the MIC. In FIGS. 4F and 4G, the arrow indicates the direction in which the MILC propagates. The MILC propagating from the portions of the source and drain regions on which the MILC source metal is applied gradually crystallizes the entire area of the active layer, and eventually forms a MILC boundary 49 at a center between the two contact holes. The technical problems associated with the MILC boundary 49 will be described with reference to another preferred embodiment of the present invention.

Since this present invention crystallizes the active layer at a relatively low temperature using a furnace, deformation or damage of the substrate can be prevented. In addition, this present invention may conduct the thermal treatment of a plurality of substrates in a furnace at a time, so that the productivity of the process can be enhanced. Besides, since the conditions for crystallizing the active layer by MILC are substantially similar to those of the annealing process for activating the dopant implanted in the active layer, it is possible to simultaneously conduct the crystallization and activation of the active layer in a single process.

FIG. 4G is a cross-sectional view illustrating the state in which the active layer is crystallized by the thermal treatment and contact electrodes 50 are formed to connect the source and drain regions of the active layer to the external circuit through the contact holes. In order to form the contact electrodes 50, conductive material such as metal or doped poly-silicon is deposited on the contact insulation layer by sputtering, heating evaporation or CVD with a thickness in the range of 500Å to 10,000 Å, more preferably with a thickness in the range of 2,000 Å to 6,000 Å. Then, the layer of the conductive material is patterned into a desired shape by wet etching or dry etching.

The contact electrode 50 may be made of the same material as the MILC source metal 46 as long as it satisfies the required electrical and the mechanical characteristics. If the MILC source metal 46 and the contact electrode 50 are made of the same material, the process of forming the MILC source metal 46 and the process of forming the contact electrode 50 may be combined into a single process. Then, the MILC source metal 46 and the contact electrode 50 can be formed as a single structure after forming the contact hole in the contact insulation layer 44, and the thermal treatment is conducted after forming the contact electrode 50. Forming the MILC source metal 46 and the contact electrode 50 as a single structure in a single deposition process, the process for fabricating the TFT can be further simplified.

The aforementioned description referring to FIGS. 4A~4G has been directed to a symmetric TFT structure where the MILC source metal 46 is formed at the locations which are symmetric with respect to the channel region. In the embodiment illustrated in FIGS. 4A~4G, the channel region may be crystallized faster because the channel region is crystallize by MILC propagating from both sides of the channel region. However, in the symmetric TFT, a MILC boundary 49 is formed in the channel area to deteriorate the characteristics of the leakage current and the field effect mobility of the channel area. Thus, it eventually deteriorates the performance of the TFT. Hereinafter, another preferred embodiment of the present invention for overcoming this disadvantage will be described.

Figure 5A:
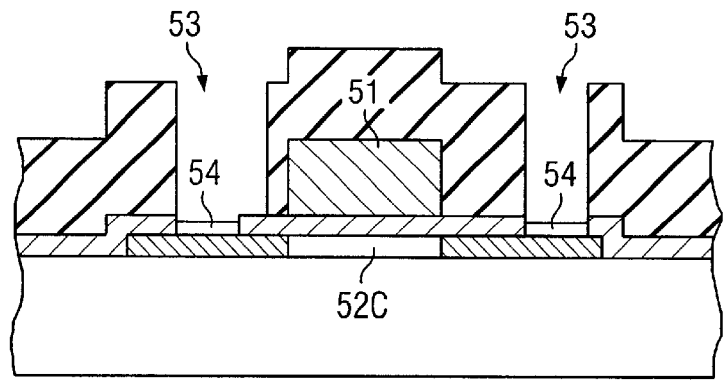
FIG. 5A and FIG. 5B are cross-sectional views illustrating the structure of a TFT fabricated according to another preferred embodiment of the present invention.
Figure 5B:
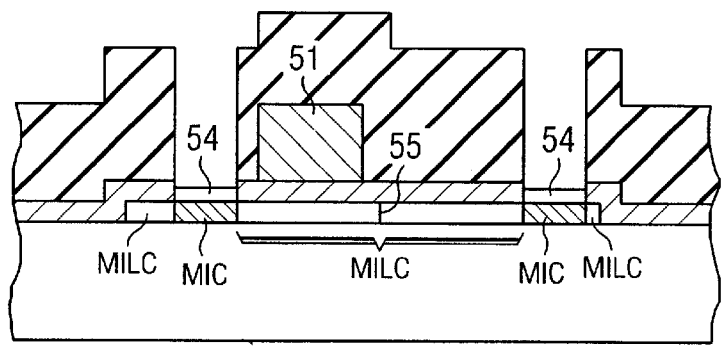

FIG. 5A and FIG. 5B are cross-sectional views illustrating a TFT structure according to another embodiment of the present invention. The TFT shown in FIG. 5A has contact holes 53 and MILC source metal 54 formed at asymmetric locations with respect to the channel region 52C. Except the location of the contact holes and the MILC source metal, the TFT shown in FIGS. 5A and 5B has the same structure as the TFT shown in FIGS. 4A to 4F. If the active layer of the TFT in FIG. 5A is crystallized by the MILC under the same condition as described above referring to FIG. 4F, the MILC boundary 55 is formed outside of the channel area 52C as shown in FIG. 5B. Thus, the problem that the MILC boundary adversely affects the characteristics of the channel region may be avoided. In the embodiment illustrated in FIGS. 5A and 5B, the position of the contact holes 53 may be freely selected so that the MILC boundary 55 is formed at a location which is separated from the channel region by at least 0.01 μm.

Table 1 below compares the field effect mobility of a TFT having a symmetric structure to that of a TFT having an asymmetric structure in which a MILC boundary in not formed in the channel area. Both TFT's have a Ni offset region formed in the source and drain regions.

TABLE 1

| Variable | N-channel | | P-channel | |
| --- | --- | --- | --- | --- |
| | Asymmetric Ni offset | Symmetric Ni offset | Asymmetric Ni offset | Symmetric Ni offset |
| Field effect mobility (cm²/Vs) | 82 | 60 | 38 | 32 |

As shown in Table 1, the Ni offset TFT having an asymmetric structure has superior field effect mobility compared to that of a TFT having a symmetric structure.

Figure 6A:
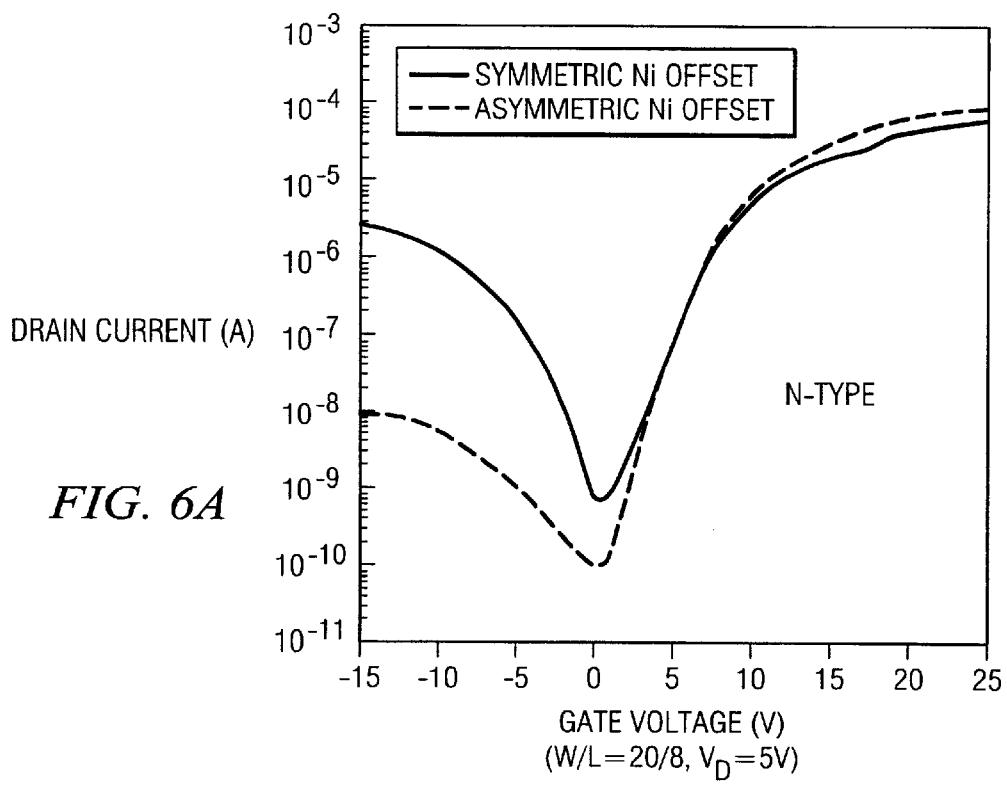
FIG. 6A and FIG. 6B are graphs respectively showing the I–V characteristic of asymmetric Ni offset TFT according to the present invention and that of a symmetric Ni offset TFT.
Figure 6B:
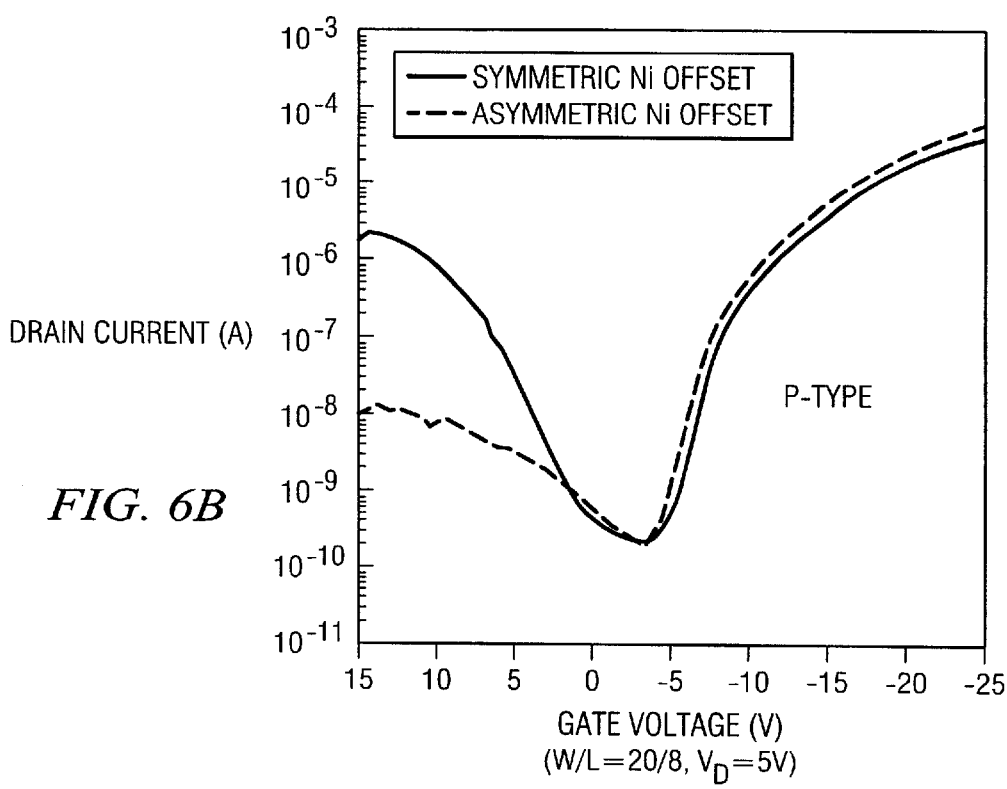

FIG. 6A and FIG. 6B are graphs respectively showing the I–V characteristic of a TFT having an asymmetric Ni offset structure and that of a TFT having a symmetrical Ni offset structure, where the channel width/length (W/L) ratio=20/8 and Vd=5, with respect to N-channel and P-channel TFT's. As shown in FIGS. 6A and 6B, the TFT having an asymmetric offset structure has a lower leakage current as compared to the TFT having a symmetric offset structure. In the light of the foregoing, it can be seen that the Ni offset TFT having an asymmetric structure has improved electrical characteristics such as the field effect mobility and the leakage current as compared to the Ni offset TFT having a symmetric structure. It is because that the electrical characteristics of the TFT channel region having a symmetric Ni offset structure is adversely affected by the MILC boundary, where the nickel-silicide which caused the MILC resides.

Figure 7:
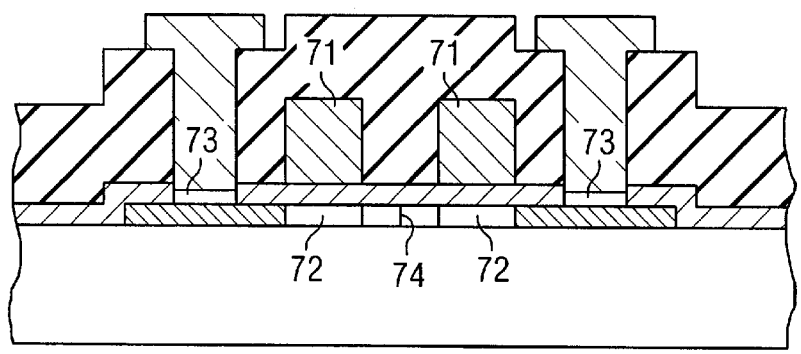
FIG. 7 is a cross-sectional view illustrating a TFT structure according to a still another preferred embodiment of the present invention.

FIG. 7 is a cross-sectional view illustrating a TFT structure according to a still another embodiment of the present invention, in which the MILC boundary is not formed in the TFT channel region. FIG. 7 shows a dual gate TFT which comprises two gate electrodes 71. The dual gate TFT may be fabricated using the same method as described referring to FIGS. 4A to 4G. The MILC source metal 73 is formed at a location symmetric with respect to a pair of gate electrodes 71. When the active layer with the MILC source metal 73 is crystallized by the thermal treatment as described referring to FIG. 4F, the MILC boundary 74 is formed between the two channel regions 72. As such, fabricating a dual gate TFT according to the method of the present invention, the problems caused by the MILC boundary formed in the channel region may be effectively prevented.

As described above, the method for fabricating a TFT according to the present invention may simultaneously crystallize a plurality of amorphous silicon layers in a furnace using the MILC at a relatively low temperature compared to those used by the RTA and the ELC method. Thus, the inventive method may enhance the productivity of crystalline TFT. In particular, the method of the present invention crystallizes the TFT active layer at a temperature range of 400° C.~600° C., which is lower than the deformation temperature of glass around of 600° C. Thus, the method of present invention can effectively prevent the deformation or damage of the substrate during the fabrication of the TFT. In addition, the present invention may simultaneously performs the crystallization and the activation process of the active layer, thereby simplifying and expediting the TFT fabrication process.

As compared to prior art for forming a metal offset area using a photoresist pattern formed on the source/drain regions of the active layer, the present invention forms the MILC source metal on selected locations in the active layer through the contact holes using the contact insulation layer as a mask. Thus, the present invention has an advantage that the MILC source metal can be offset from the channel region without requiring additional masking process. In addition, if the contact electrode is formed with the same material as the MILC source metal, the processes of forming the contact electrode and the MILC source metal can be integrated into a single process. In addition, the present invention does not form the MILC boundary in the channel region of the TFT by using dual gate electrodes or forming the MILC source metal at the asymmetric locations with respect to the channel region. Thus, the method of the present invention has an advantage of providing a TFT having improved electrical characteristics.

Although, the present invention has been described with respect to specific embodiments thereof, various changes and modifications and be carried out by those skilled in the art without departing from the scope of the invention. It is intended, therefore, that the present invention encompass such changes and modifications as fall within the scope of the appended claims.

What we claim:

1. A method for fabricating a thin film transistor (TFT) including a crystallized active layer comprising the steps of:
   (a) providing a substrate;
   (b) depositing an amorphous silicon layer on said substrate to provide an active layer of the TFT including a source, a drain and a channel regions;
   (c) forming a gate insulation layer and a gate electrode on said substrate and said active layer;
   (d) doping impurity in said source and drain regions of said active layer;
   (e) forming a contact insulation layer on said substrate, said active layer and said gate electrode and forming contact holes in said contact insulation layer to expose portions of said source and drain regions;
   (f) applying metal induced lateral crystallization (MILC) source metal on the portions of said source and drain regions exposed through said contact holes;
   (g) conducting thermal treatment of said substrate and said active layer to crystallize the active layer; and
   (h) forming contact electrodes electrically connected to said source and drain regions through said contact holes,
   wherein said contact holes are formed at asymmetric locations with respect to said gate electrode, and accordingly said metal induced lateral crystallization (MILC) source metal is formed at asymmetric locations with respect to said channel region.

2. The method for fabricating a TFT according to claim 1, wherein said MILC source metal contains at least one of Ni, Pd, Ti, Ag, Au, Al, Sn, Sb, Cu, Co, Cr, Mo, Tr, Ru, Rh, Cd and Pt.

3. The method for fabricating a TFT according to claim 1, wherein said MILC source metal is formed with a thickness in the range of 1 Å to 200 Å by sputtering, heating evaporation or CVD.

4. The method for fabricating a TFT according to claim 1, wherein the thermal treatment in said step (g) is conducted at a temperature range of 400° C. to 600° C. for 0.1 to 50 hours.

5. The method for fabricating a TFT according to claim 1, wherein said contact electrode is made of the same material as said metal induced lateral crystallization (MILC) source metal.

6. The method for fabricating a TFT according to claim 5, wherein said contact electrode and said MILC source are formed as a single body.

7. The method for fabricating a TFT according to claim 6, wherein the metal induced lateral crystallization (MILC) source metal integrated with said contact electrode has a thickness in the range of 500 Å to 10,000 Å.

8. The method for fabricating a TFT according to claim 1, wherein photoresist is used as a mask to form said contact holes in said step (e) and said step (f) is performed before removing the photoresist.

9. The method for fabricating a TFT according to claim 1, wherein photoresist is used as a mask to form said contact holes in said step (e), and the step (f) is performed after removing the photoresist.

10. The method for fabricating a TFT according to claim 1, wherein said step (d) includes a doping process for forming a lightly doped drain (LDD) region or an offset junction region in said active layer.

11. The method for fabricating TFT according to claim 1, wherein said step (d) is performed by ion implantation method or ion shower doping method using said gate electrode as a mask.

12. The method for fabricating a TFT according to claim 1, wherein the activation of the impurity doped in said active layer and the crystallization of said active layer by the metal induced lateral crystallization (MILC) are simultaneously performed in said step (g).

13. The method for fabricating a TFT according to claim 1, wherein the locations of said metal induced lateral crystallization (MILC) source metal are determined so that a boundary between the metal induced lateral crystallization (MILC) crystallization regions, is formed outside of said channel region, when each of the metal induced lateral crystallization (MILC) crystallization regions grows from the portions of said source and drain regions on which said metal induced lateral crystallization (MILC) source metal is formed in said step (f).

14. The method for fabricating a TFT according to claim 1, wherein at least two gate electrodes are formed in said step (c).

15. The method for fabricating a TFT according to claim 14, wherein the locations of said contact holes are determined so that a boundary between the metal induced lateral crystallization (MILC) crystallization regions is formed between said gate electrodes, when each of the metal induced lateral crystallization (MILC) crystallization region grows from the portions of said source and drain regions on which said MILC source metal is formed in said step (f).

* * * * *